United States Patent
Yeom

(10) Patent No.: US 7,755,531 B2
(45) Date of Patent: Jul. 13, 2010

(54) ANALOG REFERENCE VOLTAGE GENERATOR, METHOD THEREOF, ANALOG-TO-DIGITAL CONVERTER INCLUDING THE SAME, AND IMAGE SENSOR INCLUDING THE SAME

(75) Inventor: Hyun Soo Yeom, Seongnam-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 13 days.

(21) Appl. No.: 12/182,708

(22) Filed: Jul. 30, 2008

(65) Prior Publication Data

US 2009/0167585 A1    Jul. 2, 2009

(30) Foreign Application Priority Data

Dec. 29, 2007    (KR) .................... 10-2007-0141113

(51) Int. Cl.
*H03M 1/50* (2006.01)

(52) U.S. Cl. ........................ 341/166; 341/155

(58) Field of Classification Search ............... 341/155, 341/172, 159, 144, 118, 120, 166; 345/99, 345/213

See application file for complete search history.

(56) References Cited

U.S. PATENT DOCUMENTS

| 6,020,872 A * | 2/2000 | Mizukata et al. ............... 345/99 |
| 6,191,648 B1 | 2/2001 | Lewicki |
| 6,489,914 B1 * | 12/2002 | Jones et al. ................. 341/162 |
| 6,696,876 B2 * | 2/2004 | Drost et al. ................. 327/298 |
| 6,914,791 B1 * | 7/2005 | Park et al. .................... 363/60 |
| 2002/0067303 A1 * | 6/2002 | Lee et al. .................... 341/184 |

FOREIGN PATENT DOCUMENTS

| KR | 1020010039336 A | 5/2001 |
| KR | 1020030050089 A | 6/2003 |

* cited by examiner

*Primary Examiner*—Peguy JeanPierre
(74) *Attorney, Agent, or Firm*—F.Chau & Associates, LLC

(57) ABSTRACT

An analog reference voltage generator for generating a monotonously increasing or decreasing analog reference voltage includes a plurality of dump cells in front of an operational amplifier and controls the dump cells using a plurality of clock signals, respectively, which do not overlap each other in time, thereby increasing a ramping speed. The analog reference voltage generator including the plurality of dump cells controls the generation of an analog reference voltage using the plurality of clock signals obtained by dividing a master clock signal, thereby preventing the voltage level of the reference signal from decreasing due to an increase of the load.

16 Claims, 16 Drawing Sheets

//ANALOG REFERENCE VOLTAGE GENERATOR, METHOD THEREOF, ANALOG-TO-DIGITAL CONVERTER INCLUDING THE SAME, AND IMAGE SENSOR INCLUDING THE SAME

PRIORITY STATEMENT

This application claims priority under 35 U.S.C. §119 to Korean Patent Application No. 10-2007-0141113, filed on Dec. 29, 2007, in the Korean Intellectual Property Office, the entire contents of which is incorporated herein by reference.

BACKGROUND

1. Technical Field

The present disclosure relates to a semiconductor memory device and, more particularly, to a method of generating an analog reference voltage, an analog reference voltage generator, an analog-to-digital converter (ADC) including the analog reference voltage generator, and an image sensor including the ADC.

2. Discussion of Related Art

Analog signals, for example, analog signals output from pixels of an image sensor, should be converted into digital codes (or digital signals) to realize the reproduction of an image. Analog-to-digital (AD) conversion is performed using a device for converting an analog signal to a digital signal, that is, an analog-to-digital converter (ADC).

For the AD conversion, it is typically required to compare an input analog signal with a reference voltage signal. Generally, a circuit generating the reference voltage is referred to as an analog reference voltage generator, an example of which is a ramp signal generator. The ramp signal generator is a circuit that outputs a signal periodically rising or falling and having two or more signal waveforms according to the type of input analog signal.

FIG. 1 is a circuit diagram of a conventional analog reference voltage generator in the form of an integrator. The offset signal OFFSET is an input signal that determines an initial value of an output signal OUT, and a gain signal GAIN is an input signal that determines a unit variation of the output signal OUT changing in response to clock signals Clk1 and Clk2. The reset signal Reset controls the switching operation of a switch S5 to discharge a capacitor C2, so that the output signal OUT is maintained at an offset voltage level. The first and second clock signals Clk1 and Clk2 are non-overlapped clock signals, that is, respective high periods thereof do not overlap in time.

FIG. 2 is a graph showing the output signal OUT indicated in FIG. 1. The output signal OUT increases repeatedly when the clock signal Clk1 or Clk2 progresses. The above-described analog reference voltage generator accumulates charges during the period of the clock Clk1 or Clk2 at a ratio of the capacitors, that is, C1/C2, and outputs the output signal OUT according to the result of the accumulation.

FIGS. 3A, 3B, and 3C illustrate the operation of the analog reference voltage generator illustrated in FIG. 1. FIG. 4 shows waveforms of the first and second clock signals Clk1 and Clk2 and the output signal OUT. Referring to FIGS. 3A and 4, when the reset signal Reset is enabled, the output signal OUT at an output terminal of an operational amplifier Amp has the voltage level of the offset signal OFFSET. Next, when the reset signal Reset is disabled, the analog reference voltage generator starts to operate in response to the first and second clock signals Clk1 and Clk2.

More specifically, as is shown in FIG. 3B, a voltage of the input dump capacitor C1 is discharged and initialized to 0 V during a logic high (or a high level) period of the first clock signal Clk1. As is shown in FIG. 3C, an input voltage, that is, the gain signal CAIN is applied to the input dump capacitor C1 and charges stored at the input dump capacitor C1 are accumulated at the feedback capacitor C2 during a logic high period of the second clock signal Clk2, so that the output signal OUT at the output terminal of the operational amplifier Amp is changed. At this time, the output signal OUT increases as the clock signal Clk1 or Clk2 increases.

As described above, the output signal OUT of the conventional analog reference voltage generator does not increase during the logic high period of the first clock signal Clk1 and increases only during the logic high period of the second clock signal Clk2. Accordingly, a single slope ADC including this conventional analog reference voltage generator needs time corresponding to the period of 1024 pulses of the first or second clock signal Clk1 and Clk2 in order to output 10 bits of data. In addition, when the number of circuits operated by the conventional analog reference voltage generator increases, loading increases, which increases a resistive capacitive (RC) delay. A desired output signal cannot be obtained during the RC delay.

SUMMARY OF THE INVENTION

Exemplary embodiments of the present invention provide an analog reference voltage generator for outputting an output signal at a desired level faster than the frequency of a clock signal and a method thereof.

Exemplary embodiments of the present invention also provide an analog reference voltage generator for overcoming a problem of an increase in resistive capacitive (RC) delay when loading increases and a method thereof.

Exemplary embodiments of the present invention also provide an analog-to-digital converter including the analog reference voltage generator and an image sensor including the analog-to-digital converter.

According to exemplary embodiments of the present invention, there is provided a method of generating an analog reference voltage, by which an initial voltage level is set and an output signal is generated to change in an identical direction from the initial voltage level by integrating charges stored at a dump cell capacitor and a feedback capacitor connected with an output terminal through switching operation using a plurality of clock signals. The method includes dividing a master clock signal by the number of the clock signals to obtain the clock signals, and changing a level of the output signal in an identical direction in a first logic level and a second logic level of the master clock signal when a logic level of the master clock signal changes as many times as the number of clock signals. The output signal may repeatedly increase or decrease.

According to exemplary embodiments of the present invention, there is provided an analog reference voltage generator including an operational amplifier including a first input terminal receiving an input offset voltage determining an initial voltage and an output terminal; a feedback capacitor connected between a second input terminal of the operational amplifier and the output terminal; and a plurality of dump cells including dump capacitors, respectively, and configured to apply an input voltage to the dump capacitors, respectively, at different timings and accumulate charges stored at the dump capacitors at the feedback capacitor in response to a plurality of clock signals, which do not overlap each other, thereby changing an output signal of the output terminal. The plurality of clock signals may be obtained by dividing a master clock signal by the number of the clock signals, and when a logic level of the master clock signal changes as many times as the number of clock signals, a voltage level of the output signal may change in an identical direction in both of a first logic level and a second logic level of the master clock signal.

The analog reference voltage generator may further include a reset unit connected in parallel with the feedback capacitor to maintain the output signal at the input offset voltage in response to a reset signal.

Each of the dump cells may include a first switch connected between an input voltage terminal receiving the input voltage and a first end of the dump capacitor to provide the input voltage to the first end of the dump capacitor in response to a first clock signal among the plurality of clock signals, a second switch connected between the first input terminal of the operational amplifier and the first end of the dump capacitor to discharge the dump capacitor in response to a second clock signal among the plurality of clock signals, a third switch connected between a second end of the dump capacitor and the second input terminal of the operational amplifier to redistribute charges dumped from the dump capacitor at the feedback capacitor in response to the first clock signal, and a fourth switch connected between the second end of the dump capacitor and the first input terminal to discharge the dump capacitor in response to the second clock signal. The first clock signal and the second clock signal may be complementary or may not overlap each other.

According to exemplary embodiments of the present invention, an analog-to-digital converter includes an analog reference voltage generator configured to output an analog reference voltage, and a comparator configured to compare the analog reference voltage with an analog input signal and output a digital value according to a result of the comparison. The analog reference voltage generator includes an operational amplifier including a first input terminal receiving an input offset voltage determining an initial voltage and an output terminal; a feedback capacitor connected between a second input terminal of the operational amplifier and the output terminal; and a plurality of dump cells including dump capacitors, respectively, and configured to apply an input voltage to the dump capacitors, respectively, at different timings and accumulate charges stored at the dump capacitors at the feedback capacitor in response to a plurality of clock signals, which do not overlap each other, thereby changing an output signal of the output terminal. The plurality of clock signals may be obtained by dividing a master clock signal by the number of clock signals, and when a logic level of the master clock signal changes as many times as the number of clock signals, a voltage level of the output signal may change in an identical direction in both of a first logic level and a second logic level of the master clock signal.

In other embodiments, an image sensor includes a pixel array including pixels arrayed in a predetermined color pattern, and an analog-to-digital converter configured to convert an analog signal output from the pixel array into a digital signal. The analog-to-digital converter includes an analog reference voltage generator configured to generate an analog reference voltage, and a comparator configured to compare the analog reference voltage with an analog signal output from the pixel array and output a digital value according to a result of the comparison. The analog reference voltage generator includes an operational amplifier including a first input terminal receiving an input offset voltage determining an initial voltage and an output terminal; a feedback capacitor connected between a second input terminal of the operational amplifier and the output terminal; and a plurality of dump cells including respective dump capacitors and configured to apply an input voltage to the dump capacitors at different respective timings and accumulate charges stored at the dump capacitors at the feedback capacitor in response to a plurality of clock signals, which do not overlap each other, thereby changing an output signal at the output terminal. The plurality of clock signals may be obtained by dividing a master clock signal by the number of clock signals, and when a logic level of the master clock signal changes as many times as the number of clock signals, a voltage level of the output signal may change in an identical direction in both of a first logic level and a second logic level of the master clock signal.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
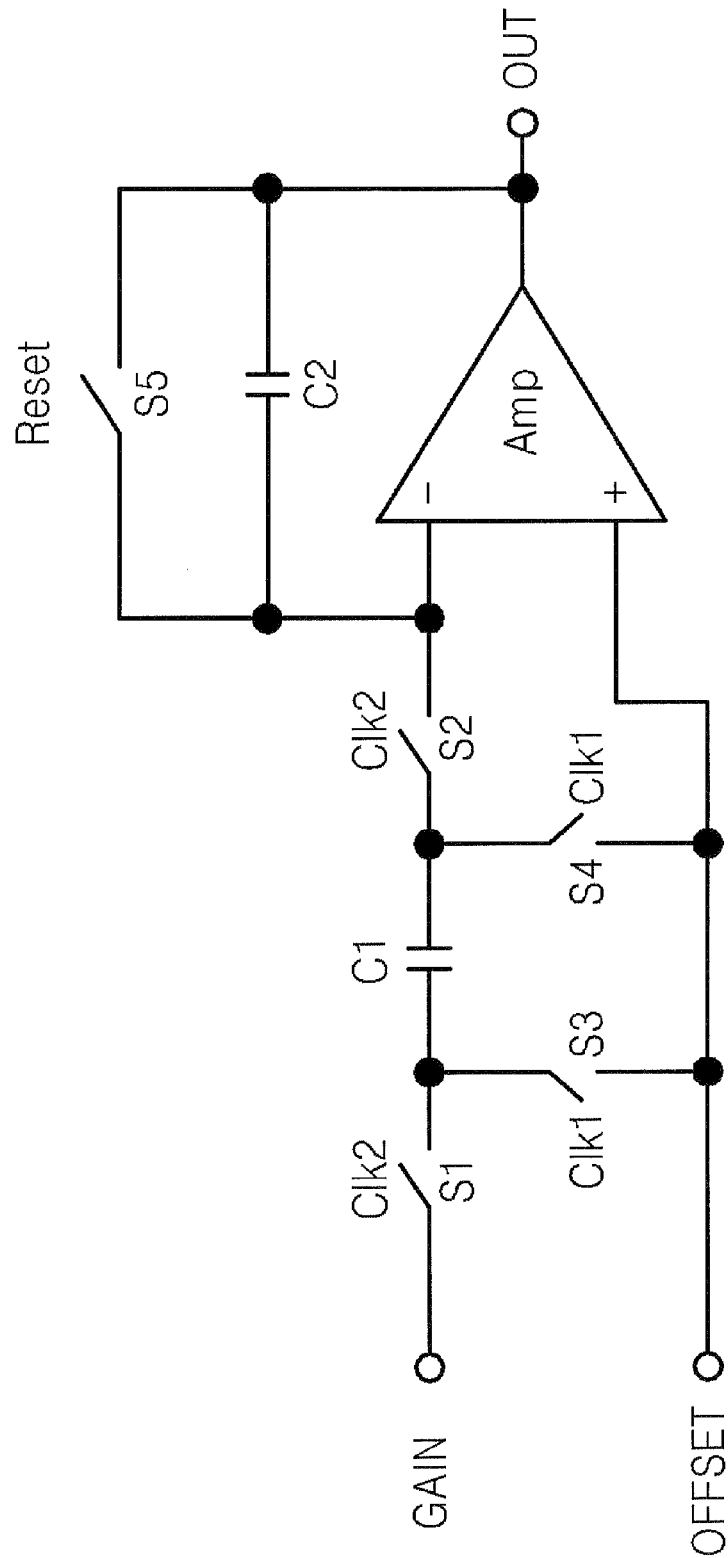
FIG. 1 is a circuit diagram of a conventional analog reference voltage generator in the form of an integrator.
Figure 2:
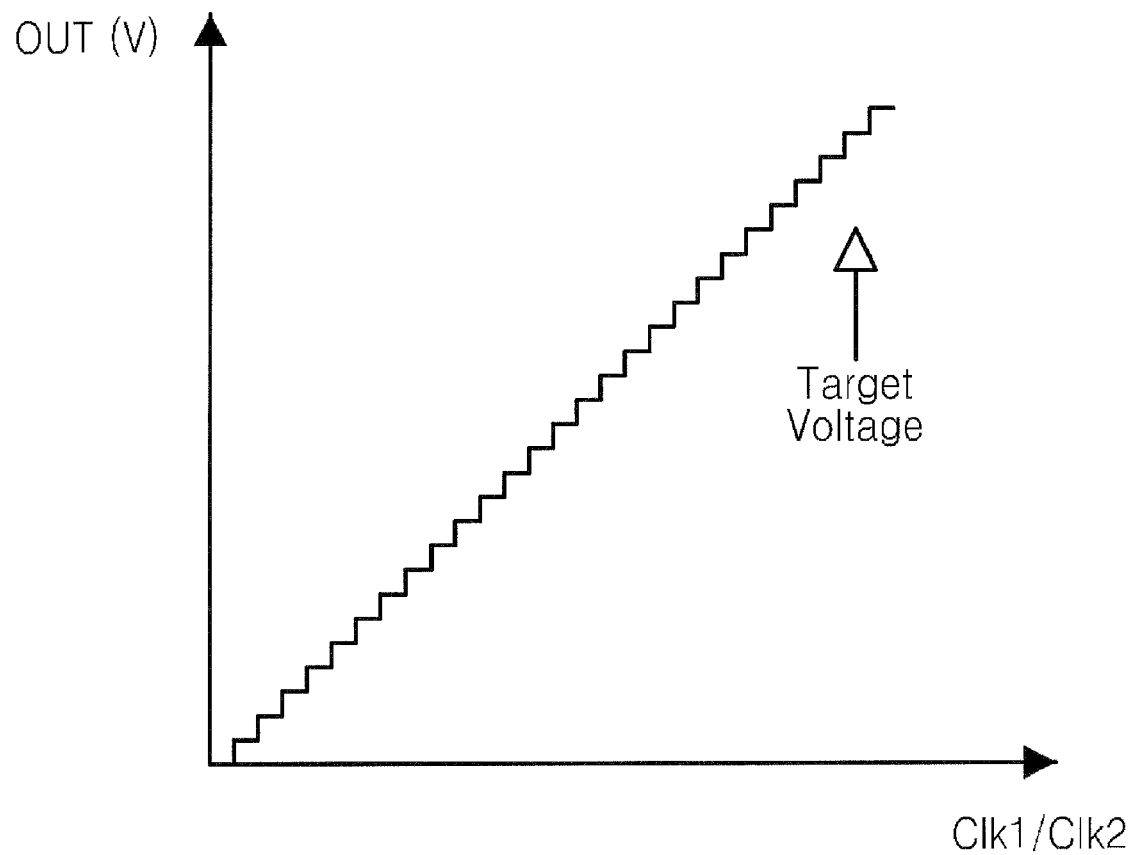
FIG. 2 is a graph showing an output signal of the analog reference voltage generator illustrated in FIG. 1.
Figure 3A:
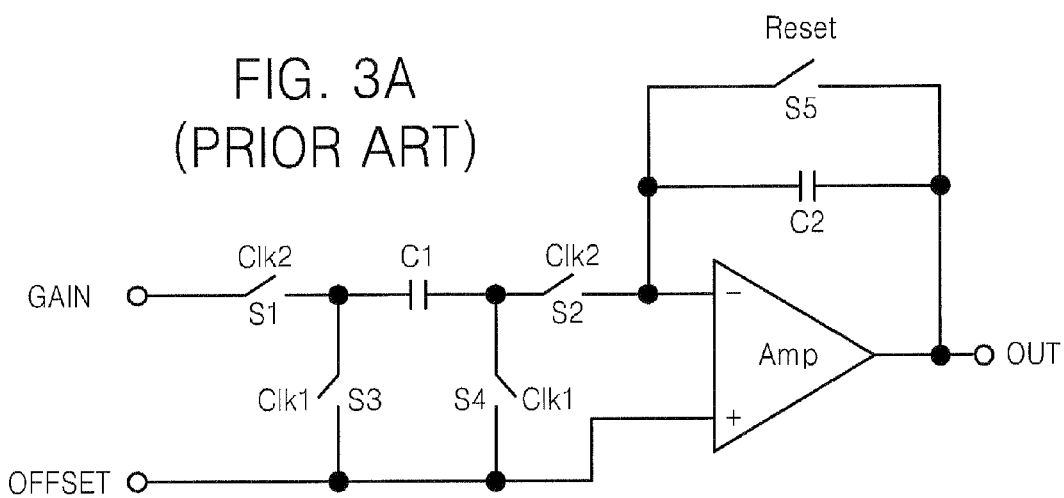
FIGS. 3A, 3B, and 3C illustrate the operation of the analog reference voltage generator illustrated in FIG. 1.
Figure 3B:
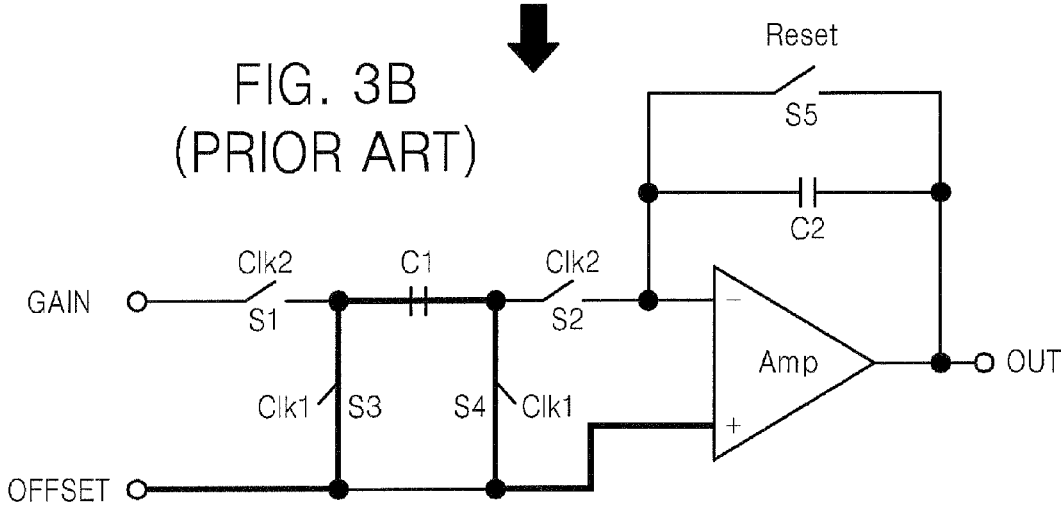
Figure 3C:
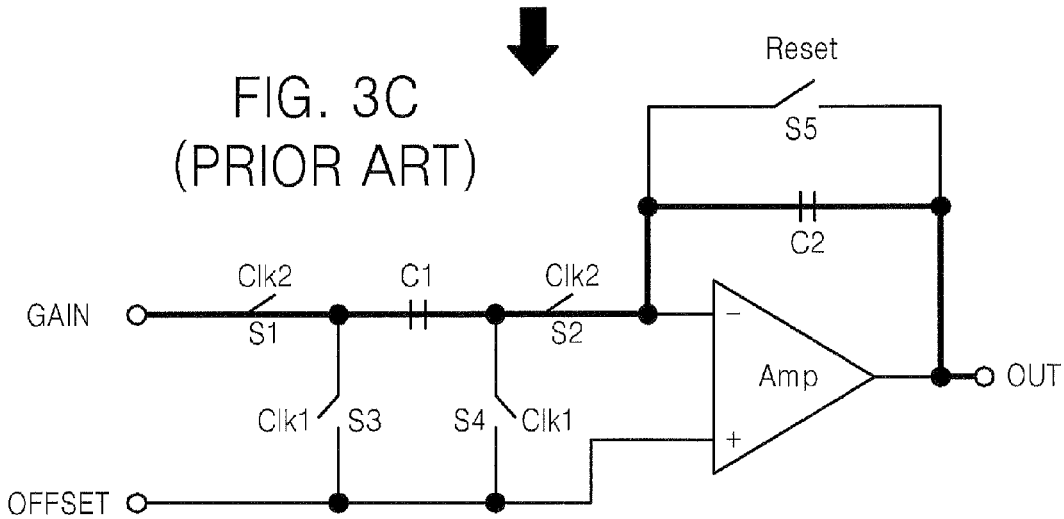
Figure 4:
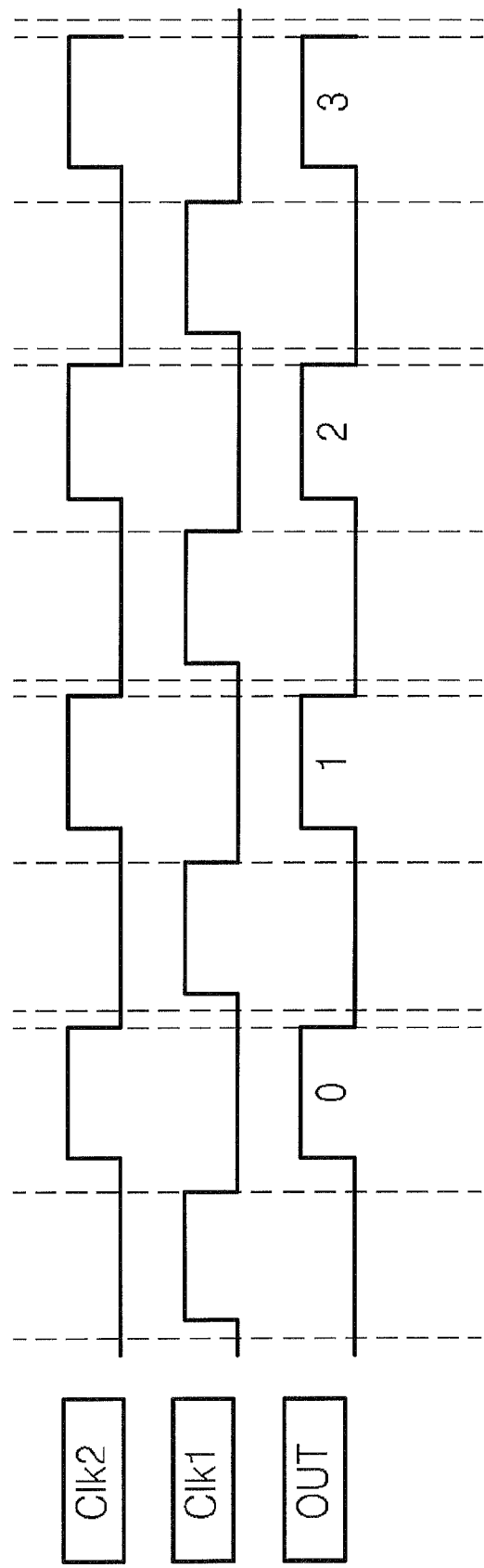
FIG. 4 shows waveforms of clock signals and the output signal of the generator illustrated in FIG. 1.

Exemplary embodiments of the present invention now will be described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. In the drawings, the size and relative sizes of layers and regions may be exaggerated for clarity. Like numbers refer to like elements throughout.

Figure 5:
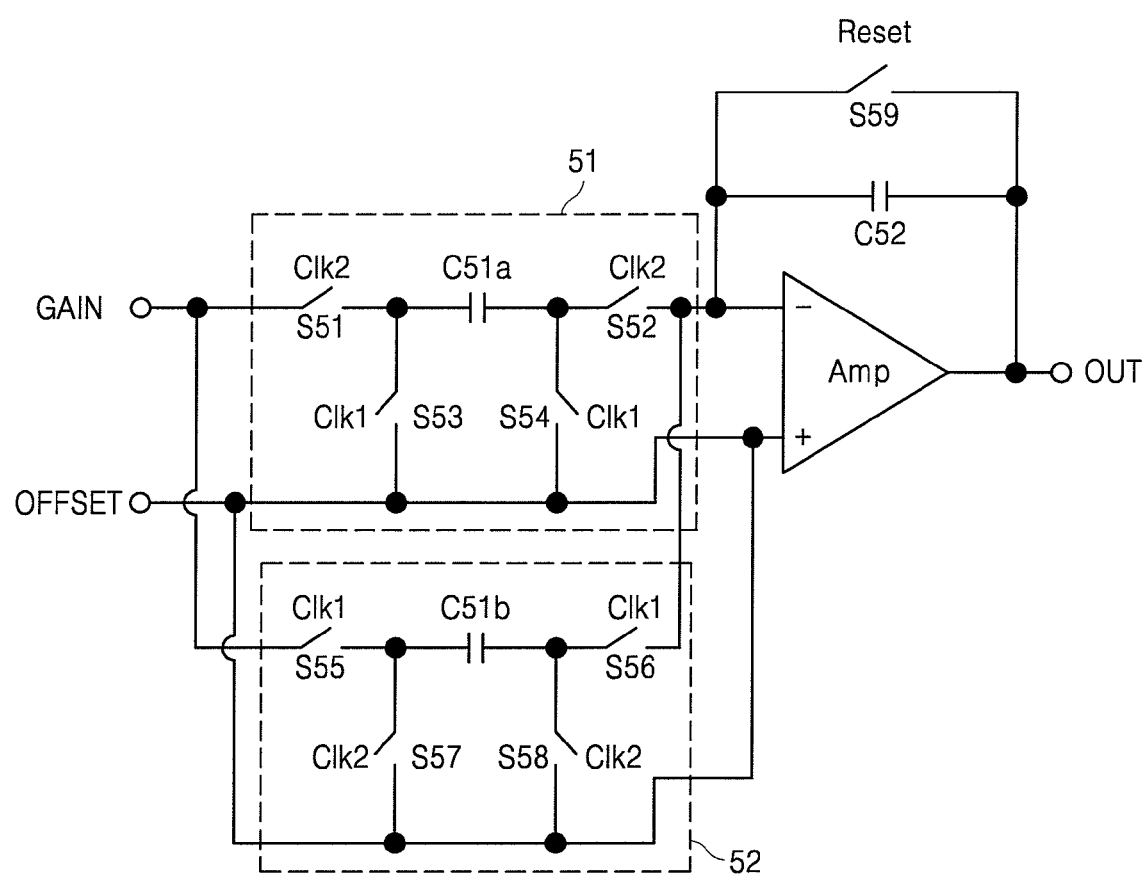
FIG. 5 is a circuit diagram of an analog reference voltage generator according to an exemplary embodiment of the present invention.
Figure 7:
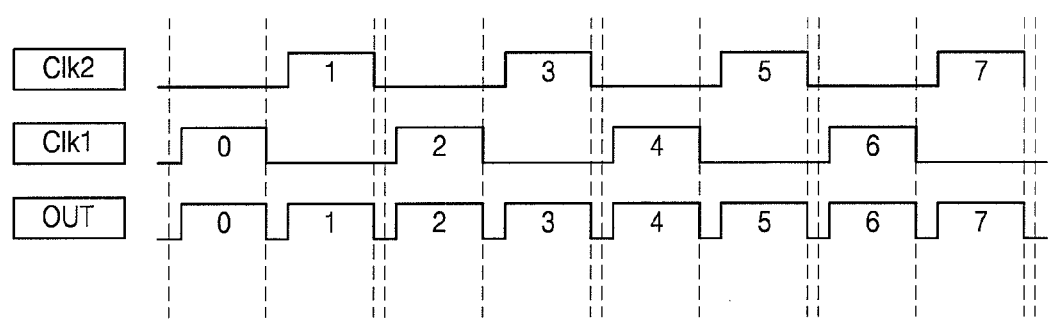
FIG. 7 shows waveforms of clock signals and an output signal of the generator illustrated in FIG. 5.

FIG. 5 is a circuit diagram of an analog reference voltage generator according to an exemplary embodiment of the present invention. Referring to FIG. 5, an offset signal OFFSET determines an initial value of an output signal OUT and a gain signal GAIN determines a unit variation of the output signal OUT that changes per clock signal, that is, at least one clock signal among the clock signals Clk1 or Clk2. A reset signal Reset controls the switching operation of a switch S59 to discharge the voltage or charges of a capacitor C52, so that the output signal OUT at an output terminal is maintained at an offset voltage level. As illustrated in FIG. 7, pulses of the clock signals Clk1 and Clk2 do not overlap each other.

The analog reference voltage generator illustrated in FIG. 5 has the structure of an integrator and outputs the output signal OUT, which repeatedly increases as the number of toggles of the first and second clock signals Clk1 and Clk2 increases.

The output signal OUT of the conventional analog reference voltage generator illustrated in FIG. 1 does not increase during the logic high period of the first clock signal Clk1 but increases during the logic high period of the second clock signal Clk2. In the analog reference voltage generator according to an exemplary embodiment of the present invention, however, the output signal OUT increases during both the logic high period of the first clock signal Clk1 and the logic high period of the second clock signal Clk2, so that the output signal OUT can reach a desired level faster, for example, two times faster in the structure illustrated in FIG. 5 than a frequency of a master clock signal. In this exemplary embodiment, the first and second clock signals Clk1 and Clk2 are generated using at least part of the master clock signal.

The analog reference voltage generator according to an exemplary embodiment of the present invention includes an operational amplifier Amp and two dump cells 51 and 52. The operational amplifier Amp receives the offset signal OFFSET through a first input terminal, for example, a positive (+) input terminal, and outputs the output signal OUT through an output terminal. The feedback capacitor C52 forms a feedback loop between a second input terminal, for example, a negative (−) input terminal of the operational amplifier Amp and the output terminal of the operational amplifier Amp.

The two dump cells 51 and 52 include input dump capacitors C51a and C51b, respectively Each of the dump cells 51 and 52 applies the gain signal GAIN to the input dump capacitor C51a or C51b and allows charges stored at the input dump capacitor C51a or C51b to be accumulated at the feedback capacitor C52 in response to the clock signal Clk2 or Clk1, thereby changing the output signal OUT.

The reset switch S59 forms a reset unit and is connected in parallel with the feedback capacitor C52. The reset switch S59 maintains the output signal OUT at the output terminal of the operational amplifier Amp at a voltage of the offset signal OFFSET in response to the reset signal Reset closing switch S59.

The first dump cell 51 includes the input dump capacitor C51a, a plurality of switches S53 and S54 controlled by the first clock signal Clk1, and a plurality of switches S51 and S52 controlled by the second clock signal Clk2. The second dump cell 52 includes the input dump capacitor C51b, a plurality of switches S55 and S56 controlled by the first clock signal Clk1, and a plurality of switches S57 and S58 controlled by the second clock signal Clk2.

In this exemplary embodiment, the two dump cells 51 and 52 have the same sizes and connections of elements, with the exception that they use the non-overlapped clocks Clk1 and Clk2, respectively. Accordingly, each of the dump cells 51 and 52 has a similar structure to a corresponding part of the conventional analog reference voltage generator illustrated in FIG. 1, with the exception that the clock signal Clk1 or Clk2 controlling the dump cell 51 or 52 is opposite to that controlling the corresponding part of the conventional analog reference voltage generator.

The analog reference voltage generator according to an exemplary embodiment of the present invention, however, increases the output signal OUT during the logic high periods of both clock signals Clk1 and Clk2, which do not overlap each other, that is, during both a logic high period and a logic low period of the master clock signal, thereby providing the output signal OUT at a desired level two times faster than the conventional analog reference voltage generator.

Figure 6A:
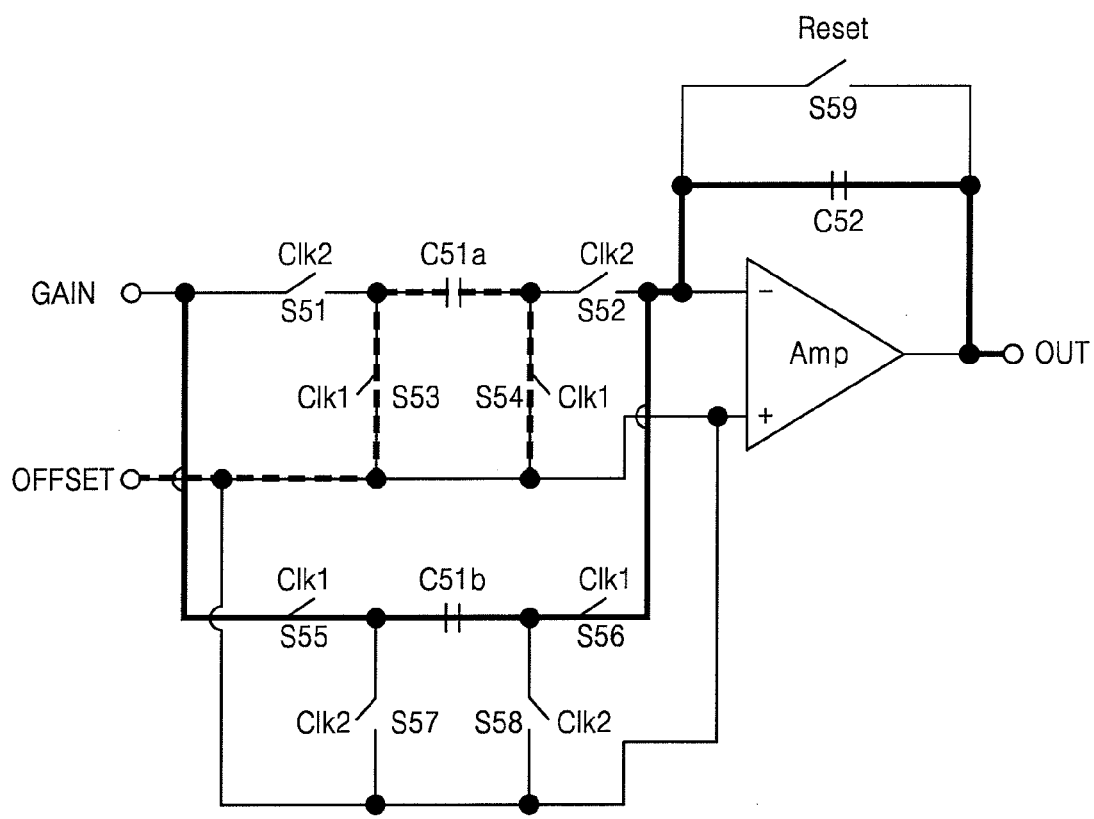
FIGS. 6A and 6B illustrate the operation of the analog reference voltage generator illustrated in FIG. 5.
Figure 6B:
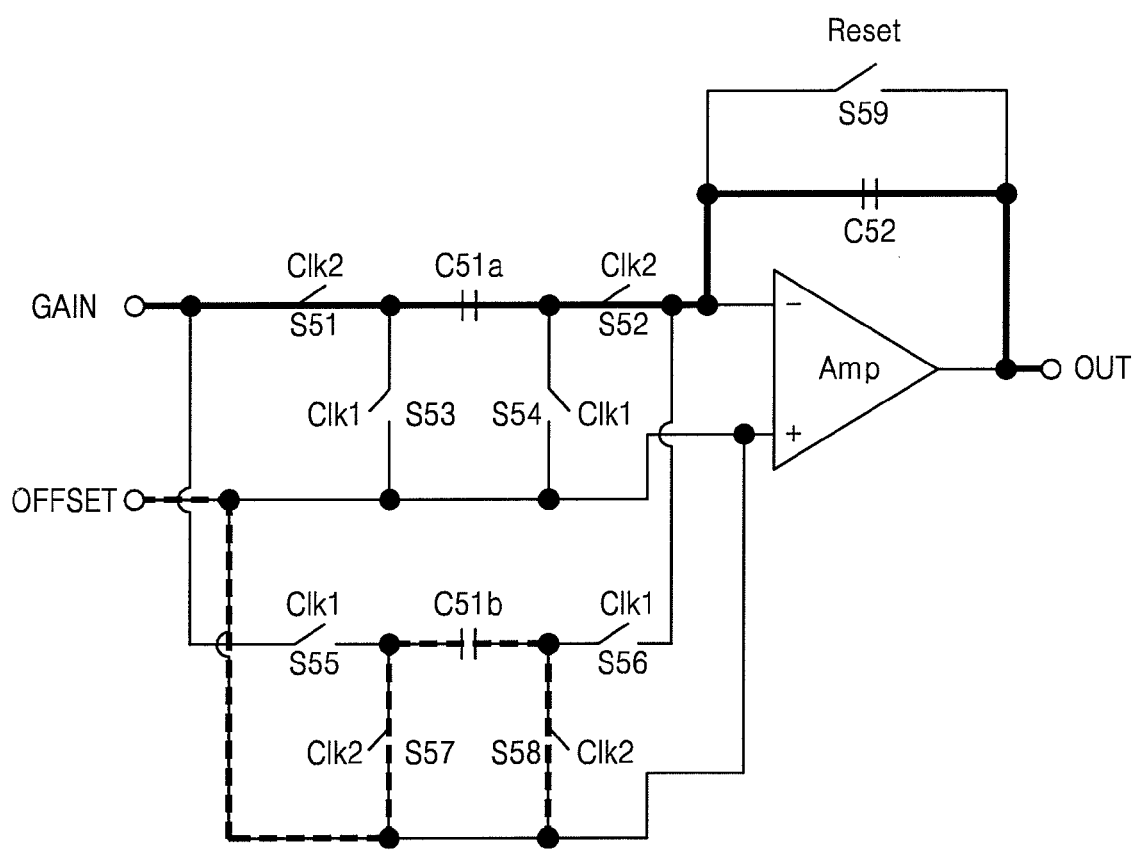

FIGS. 6A and 6B illustrate the operation of the analog reference voltage generator illustrated in FIG. 5. FIG. 7 shows waveforms of the clock signals Clk1 and Clk2 and the output signal OUT. Referring to FIGS. 6A through 7, when the reset signal Reset is enabled and switch S59 closed, the output signal OUT at the output terminal of the operational amplifier Amp has the voltage level of the offset signal OFFSET. Next, when the reset signal Reset is disabled and switch S59 opened, the analog reference voltage generator starts operation in response to the clock signals Clk1 and Clk2.

More specifically, as illustrated in FIGS. 5 and 6A, the voltage (or charges) of the input dump capacitor C51a of the first dump cell 51 is discharged and initialized to 0 V during the logic high period of the first clock signal Clk1. Meanwhile, in the second dump cell 52, the input voltage, that is, the gain signal GAIN is applied to the input dump capacitor C51b in response to the first clock signal Clk1 and charges stored at the input dump capacitor C51b are accumulated at the feedback capacitor C52 in response to the first clock signal Clk1, so that the output signal OUT at the output terminal of the operational amplifier Amp is increased by a unit voltage.

As illustrated in FIGS. 5 and 6B, the voltage (or charges) stored at the input dump capacitor C51b of the second dump cell 52 is discharged and initialized to 0 V during the logic high period of the second clock signal Clk2. Meanwhile, in the first dump cell 51, the gain signal GAIN is applied to the input dump capacitor C51b and charges stored at the input dump capacitor C51b are accumulated at the feedback capacitor C52, so that the output signal OUT at the output terminal of the operational amplifier Amp is increased by the unit voltage.

As is described with reference to FIGS. 5 through 6B, the analog reference voltage generator according to exemplary embodiments of the present invention increases the output signal OUT during both the logic high period of the first clock signal Clk1 and the logic high period of the second clock signal Clk2, thereby operating two times faster than a conventional analog reference voltage generator. In addition, because only one dump cell 51 or 52 operates during the logic high period of the clock signal Clk1 or Clk2 in the structure illustrated in FIG. 5, the loading condition of the operational amplifier Amp is constant. Accordingly, while an operating speed is increased, it is not necessary to increase the size or power consumption of the operational amplifier Amp.

The present invention is not restricted to using the two clock signals Clk1 and Clk2. In other exemplary embodiments of the present invention, an analog reference voltage generator may include a plurality of dump cells that operate in response to a plurality of clock signals, respectively, which do not overlap each other, and change the voltage level of an analog reference voltage as many times as the number of clock signals.

Figure 8:
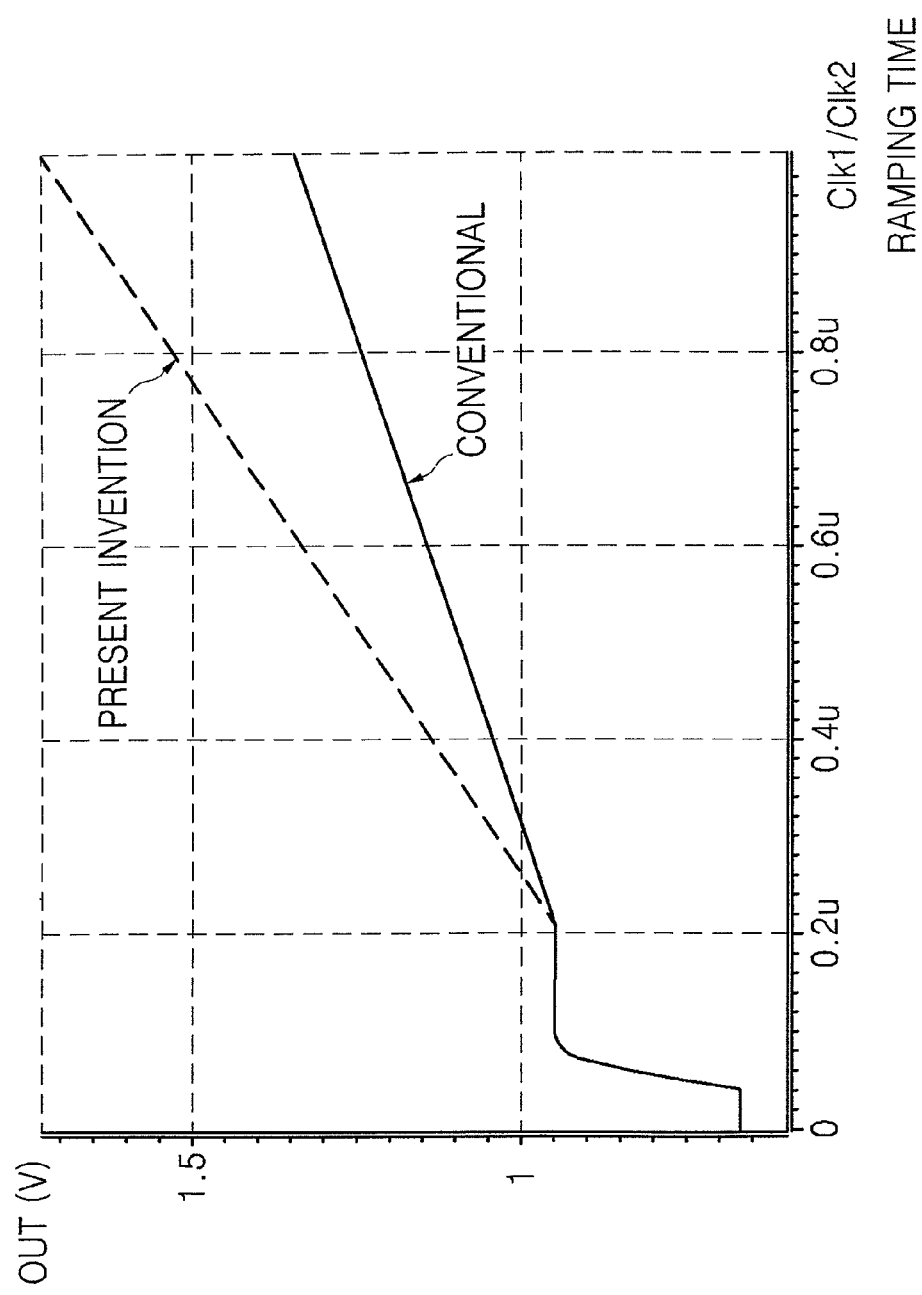
FIG. 8 is a graph showing the results of simulating output signals of the analog reference voltage generators illustrated in FIGS. 1 and 5, respectively.
Figure 9A:
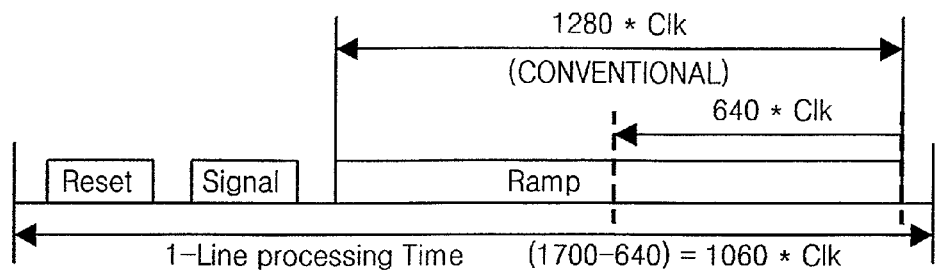
FIGS. 9A and 9B are diagrams for explaining the simulation results illustrated in FIG. 8.
Figure 9B:
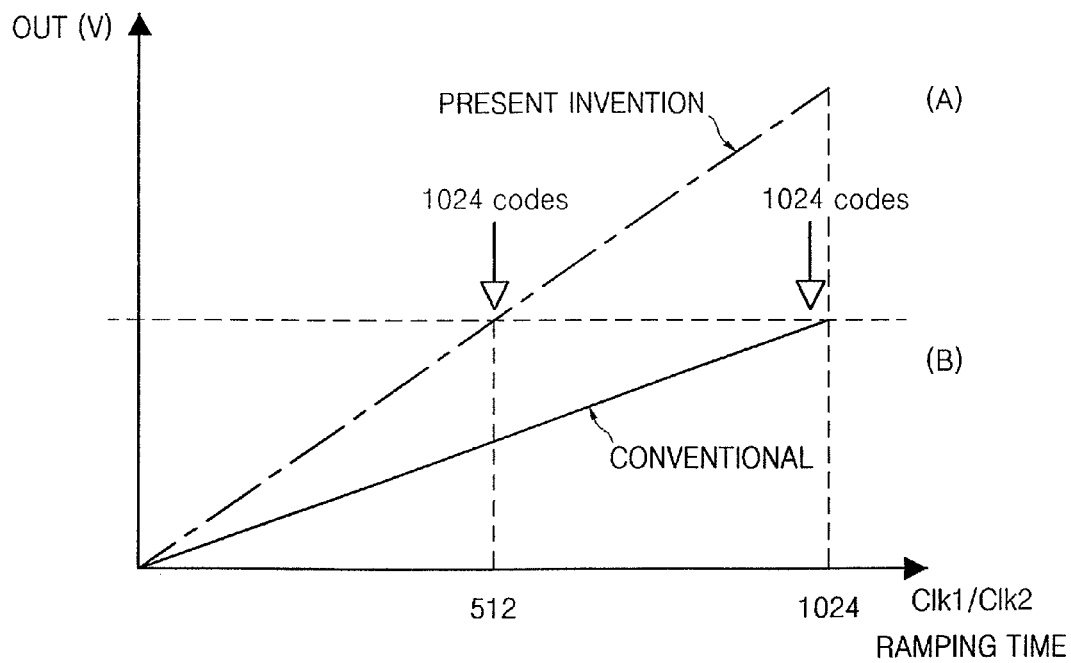

FIG. 8 is a graph showing the results of simulating the output signals OUT of the analog reference voltage generators illustrated in FIGS. 1 and 5. More specifically, the broken line represents operation of the system of the exemplary embodiment shown in FIG. 5 and the solid line represents the operation of the conventional system of FIG. 1. FIG. 9A is a diagram for explaining the simulation results illustrated in FIG. 8. Referring to FIGS. 8 and 9A, when a processing time for a single row of an image sensor having 2 megapixels is 1700 clocks (1700*Clk), a time corresponding to 1280 clocks in the processing time is a time required to operate a ramp generator. When an analog reference voltage generator of an exemplary embodiment of the present invention is applied to an image sensor, a ramping time can be reduced by half (640=1280/2 Clk) without increasing the size and power consumption of the analog reference voltage generator. For example, an image sensor that conventionally has a processing time of 1060*Clk for a single line and operates at a speed of 30 frames per second (FPS) can be made to operate at a speed of 45 FPS or more. FIG. 9B shows the response (A) of the present invention is two times faster in producing the 1024 codes than the response (B) of the conventional approach.

Figure 10A:
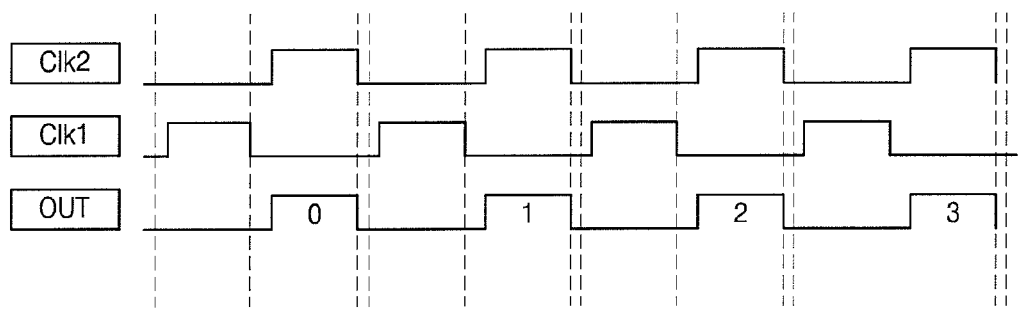
FIG. 10A is a timing chart illustrating the operation of a conventional analog reference voltage generator.

FIG. 10A is a timing chart illustrating operation of a conventional analog reference voltage generator that accumulates charges at a feedback capacitor during only one half period of a clock signal. In this case, when an image sensor has a high resolution, that is, when the number of columns to be driven increases, an output load of the analog reference voltage generator increases and it becomes difficult to output a fall code.

Figure 10B:
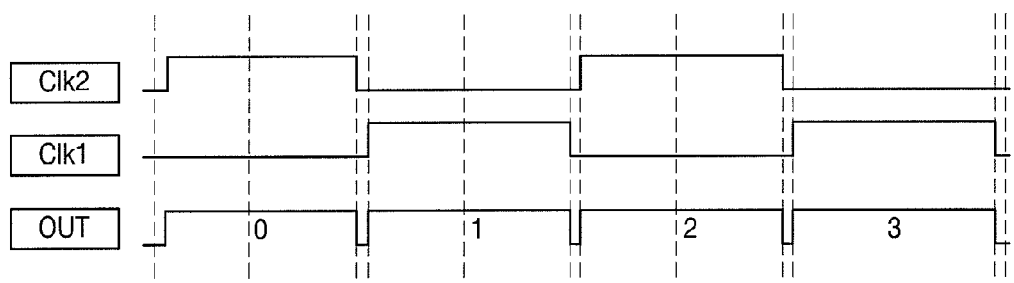
FIG. 10B is a timing chart illustrating the operation of an analog reference voltage generator according to an exemplary embodiment of the present invention.

FIG. 10B is a timing chart illustrating operation of an analog reference voltage generator according to an exemplary embodiment of the present invention. The analog reference voltage generator according to an exemplary embodiment of the present invention includes two dump cells like the analog reference voltage generator illustrated in FIG. 5 but operates with timing obtained by dividing a master clock by 2, unlike the timing illustrated in FIG. 7. Accordingly, a resistive capacitive (RC) time for storing charges at a feedback capacitor is two times longer than that of an analog reference voltage generator using the timing illustrated in FIG. 7, so that a settling time is secured and the same output signal as that obtained by the analog reference voltage generator illustrated in FIG. 5 can be obtained. In this exemplary embodiment, a circuit for 2 megapixels with a load of 1200 comparators can be used for 8 megapixels (3264×2448) with a load of 3200 comparators in an image sensor.

In the exemplary embodiments whose operations are illustrated in FIGS. 10A and 10B, each clock signal Clk1 or Clk2 is obtained by dividing an input frequency by 2 but may be obtained by dividing the frequency by "n", where "n" is a natural number. In addition, the period of each clock signal Clk1 or Clk2 has ½ of the period of a master clock signal but may have 1/n of the period of the master clock signal.

Figure 11:
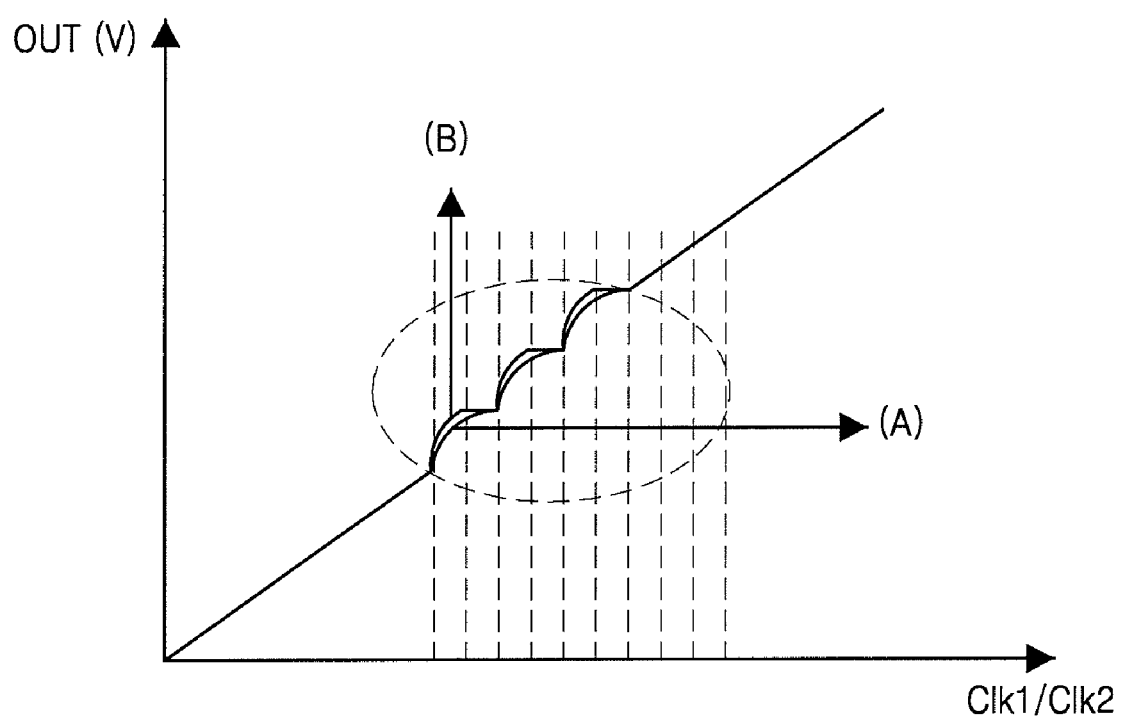
FIG. 11 is a graph for comparing an output signal of the conventional analog reference voltage generator with an output signal of the analog reference voltage generator according to an exemplary embodiment of the present invention.

FIG. 11 is a graph comparing the operation of the conventional analog reference voltage generator with the operation of the analog reference voltage generator according to an exemplary embodiment of the present invention. Referring to FIG. 11, in the conventional analog reference voltage generator, ramping occurs during one half of each of two periods of a master clock signal and does not occur during the other half of each period, as indicated by reference character B. On the other hand, in the analog reference voltage generator according to an exemplary embodiment of the present invention, the output signal OUT consecutively increases with a single period during two periods of the master clock signal, as is indicated by reference character A.

Figure 12:
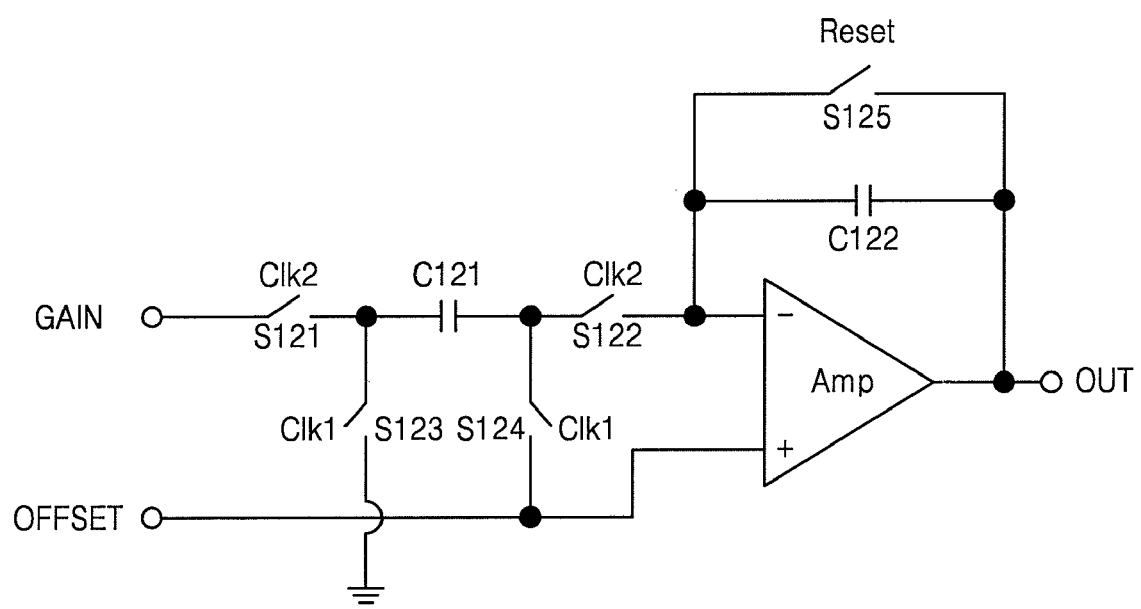
FIGS. 12 and 13 are circuit diagrams of analog reference voltage generators according to exemplary embodiments of the present invention.
Figure 13:
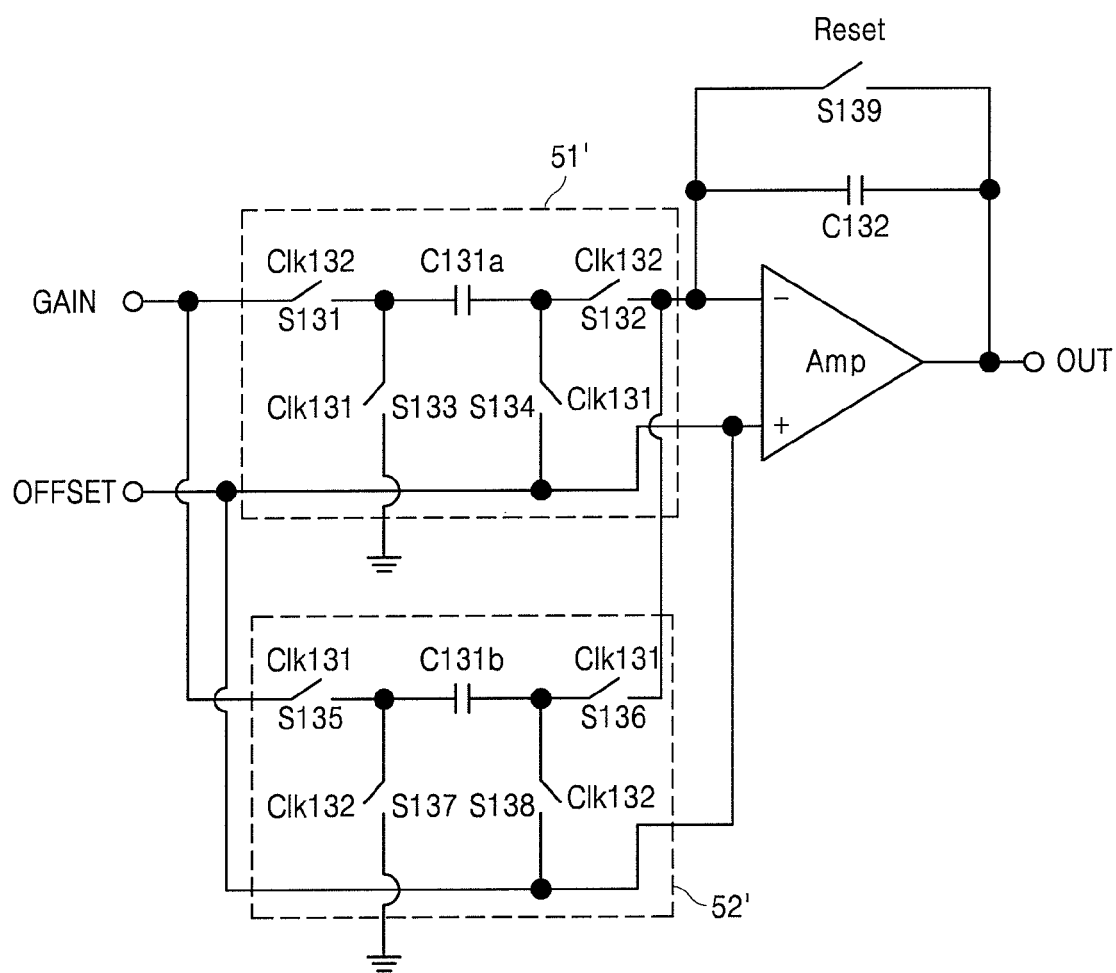

FIGS. 12 and 13 are circuit diagrams of analog reference voltage generators according to exemplary embodiments of the present invention. The analog reference voltage generator illustrated in FIG. 12 has a structure contrasted with that of the conventional analog reference voltage generator illustrated in FIG. 1. Although the two analog reference voltage generators respectively have similar elements, the switch S3 in FIG. 1 is connected with the first input terminal, that is, the positive (+) input terminal, of the operational amplifier Amp in the conventional analog reference voltage generator illustrated in FIG. 1, while a switch S123 corresponding to the switch S3 is grounded. Accordingly, the output signal OUT of the conventional analog reference voltage generator illustrated in FIG. 1 repeatedly increases from a low level according to increases of the clock signal Clk1 or Clk2, but the output signal OUT of the analog reference voltage generator illustrated in FIG. 12 repeatedly decreases from the voltage level of the offset signal OFFSET according to increases of the clock signal Clk1 or Clk2.

The analog reference voltage generator illustrated in FIG. 13 adds two dump cells 51' and 52' to the analog reference voltage generator illustrated in FIG. 12 and has a similar structure to that of the analog reference voltage generator illustrated in FIG. 5. Thus, a detailed description thereof will be omitted. When the analog reference voltage generator illustrated in FIG. 13 uses the clock signals Clk1 and Clk2 illustrated in FIG. 10B, a full code can be expressed even if there is a relatively large load on the output terminal.

Figure 14:
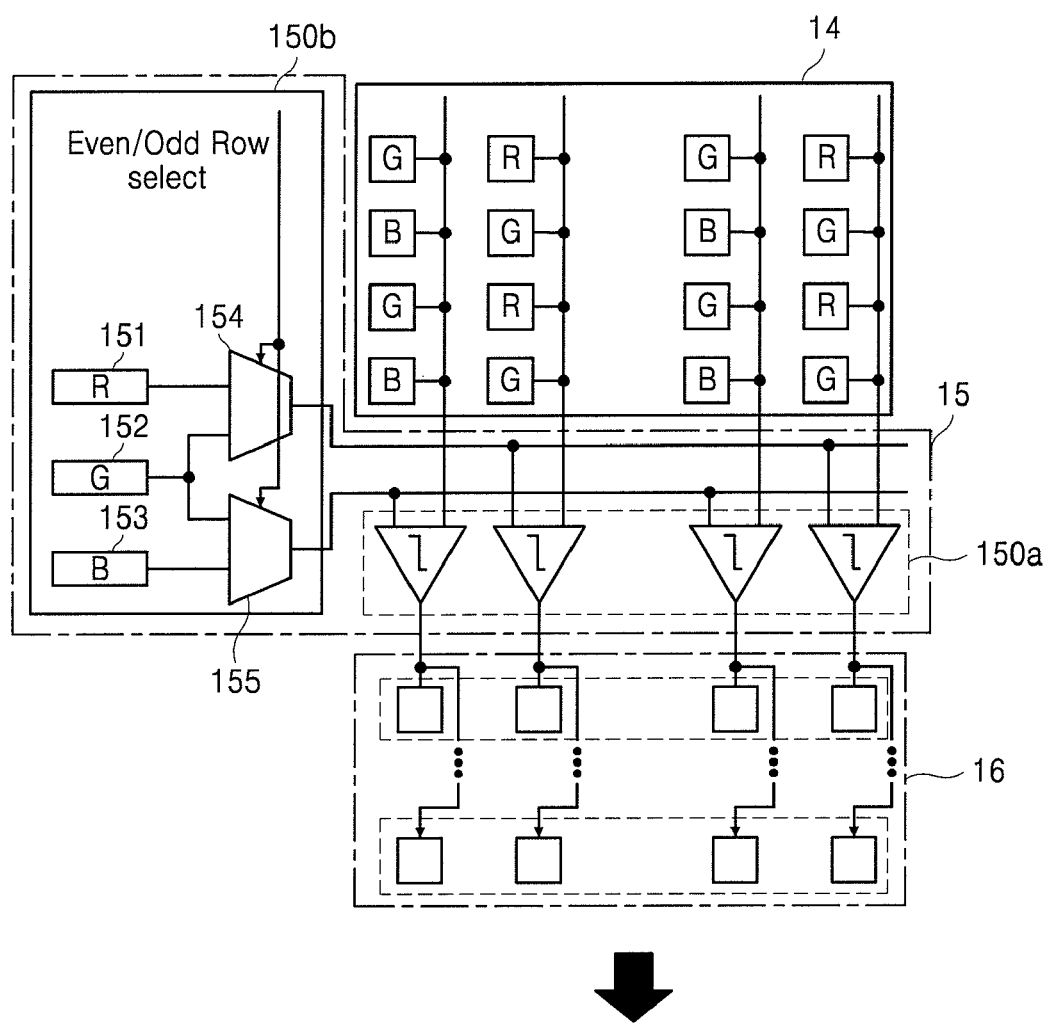
FIG. 14 is a block diagram of an image sensor including an analog-to-digital converter (ADC) having an analog reference voltage generator according to an exemplary embodiment of the present invention.

FIG. 14 is a block diagram of an image sensor having an analog-to-digital converter (ADC) including an analog reference voltage generator according to an exemplary embodiment of the present invention. The image sensor illustrated in FIG. 14 supports what is known as correlated double sampling (CDS). The image sensor includes a pixel array 14 in which a plurality of pixels are arrayed in a Bayer pattern, a single-slope ADC 15 converting an analog signal output from the pixel array 14 into a digital signal, and a latch array 16 storing the digital signal output from the ADC 15. The output of the latch array 16 is fed to an image signal processor (ISP).

More specifically, the ADC 15 includes a reference signal generator 150b that generates an analog reference voltage and a comparator 150a that receives analog output signals respectively output from columns in the pixel array 14 and the analog reference voltage, compares the analog output signal of each column with the analog reference voltage, and outputs a digital signal of the column to the latch array 16. The reference signal generator 150b includes an R (red) ramp signal generator 151, a G (green) ramp signal generator 152, and a B (blue) ramp signal generator 153 that generate ramp signals used as reference voltages for the different colors, respectively; and two selectors 154 and 155 each of which selectively outputs a reference voltage for a certain color in response to an Odd/Even Row Select control signal generated according to a filter pattern of the pixel array 14. In this exemplary embodiment, each of the R ramp signal generator 151, the G ramp signal generator 152, and the B ramp signal generator 153 may be implemented by an integrator circuit for generating an analog reference voltage for a corresponding color. In the image sensor illustrated in FIG. 14, the Bayer pattern of RGB is used, but the present invention can be used for any color filter array including combination of yellow, magenta, and cyan filters or a combination of white and black.

When a signal input to the comparator 150*a* has been formed in accordance with CDS, that is, it corresponds to a difference between a reset level and a sensing signal level, an analog reference voltage has a waveform that repeatedly increases or decreases only once. On the other hand, when the signal input to the comparator 150*a* has not been formed in accordance with CDS, that is, when the reset level and the sensing signal level are sequentially input, the analog reference voltage has a waveform that repeatedly increases or decreases at least two times for comparison with each of two levels. In this exemplary embodiment, CDS is performed using a digital value stored at the latch array 16, and this CDS is referred to as digital CDS.

Figure 15:
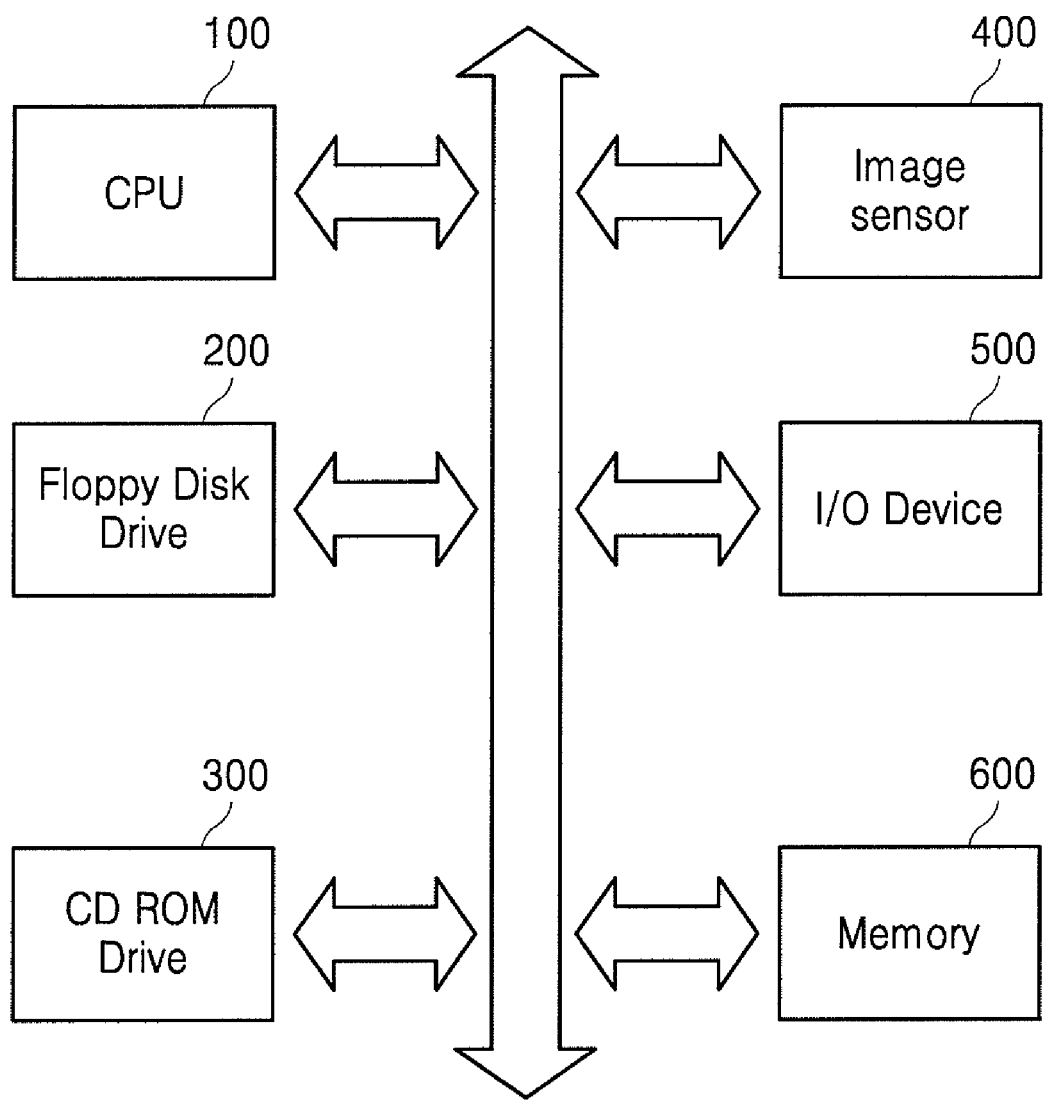
FIG. 15 illustrates a computer system including an image sensor according to an exemplary embodiment of the present invention.

FIG. 15 illustrates a computer system including an image sensor according to an exemplary embodiment of the present invention. Referring to FIG. 15, the computer system transfers data through a system bus and a local bus and includes a central processing unit (CPU) 100, a floppy disk drive 200, a compact disk read-only memory (CD ROM) drive 300, an image sensor 400, an input/output (I/O) device 500, and a memory 600.

Although not shown, the memory 600 may include a random access memory (RAM) forming a volatile memory, a flash memory forming a non-volatile memory, or a PRAM. Although not shown, the image sensor 400 may be combined with a camera body, driver, external lens, and the like in module form, comprising a camera.

As described above, according to exemplary embodiments of the present invention, an analog reference voltage generator for generating a repeatedly increasing or decreasing analog reference voltage includes a plurality of dump cells in front of an operational amplifier and controls the dump cells using a plurality of clock signals that do not overlap each other, thereby increasing a ramping speed. According to exemplary embodiments of the present invention, an analog reference voltage generator includes a plurality of dump cells and controls the generation of an analog reference voltage using a plurality of clock signals obtained by dividing a master clock signal, thereby preventing the voltage level of the reference signal from decreasing due to an increase of the load.

According to exemplary embodiments of the present invention, an analog reference voltage generator outputs an output signal at a desired voltage level faster than the frequency of a clock signal or solves an RC delay problem regardless of an increase of the load, thereby remarkably improving the performance. In addition, an exemplary embodiment of the present invention increases the performance of an ADC including the analog reference voltage generator and the performance of an image sensor including the ADC.

While the present invention has been particularly shown and described with reference to exemplary embodiments thereof, it will be understood by those of ordinary skill in the art that various changes in form and detail may be made therein without departing from the spirit and scope of the present invention, as defined by the following claims.

What is claimed is:

1. A method of generating an analog reference voltage, by which an initial voltage level is set and an output signal is generated to change in the same direction from the initial voltage level by integrating charges stored at a dump cell capacitor connected to a feedback capacitor connected with an output terminal of the output signal through a switching operation using a plurality of clock signals, the method comprising:

dividing a master clock signal by the number of the plurality of clock signals to obtain the plurality of clock signals; and changing a level of the output signal in the same direction in a first logic level and a second logic level of the master clock signal when a logic level of the master clock signal changes as many times as the number of the plurality of clock signals.

2. The method of claim 1, wherein the output signal repeatedly increases or decreases.

3. An analog reference voltage generator comprising:

an operational amplifier having a first input terminal receiving an input offset voltage determining an initial voltage and having an output terminal;

a feedback capacitor connected between a second input terminal of the operational amplifier and the output terminal; and a plurality of dump cells comprising dump capacitors, respectively, and configured to apply an input voltage to the dump capacitors at different respective timings and to accumulate charges stored at the dump capacitors at the feedback capacitor in response to a plurality of clock signals fed thereto, wherein the plurality of of clock signals do not overlap each other in time, thereby changing an output signal at the output terminal, wherein the plurality of clock signals are obtained by dividing a master clock signal by the number of the plurality of clock signals, and when a logic level of the master clock signal changes as many times as the number of the plurality of clock signals, a voltage level of the output signal changes to the same direction in response to both a first logic level and a second logic level of the master clock signal.

4. The analog reference voltage generator of claim 3, wherein the output signal repeatedly increases or decreases.

5. The analog reference voltage generator of claim 3, further comprising a reset unit connected in parallel with the feedback capacitor to maintain the output signal at the input offset voltage in response to a reset signal.

6. The analog reference voltage generator of claim 3, wherein each of the plurality of dump cells comprises:

a first switch connected between an input voltage terminal receiving the input voltage and a first end of the dump capacitor to provide the input voltage to the first end of the dump capacitor in response to a first clock signal among the plurality of clock signals;

a second switch connected between the first input terminal of the operational amplifier and the first end of the dump capacitor to discharge the dump capacitor in response to a second clock signal among the plurality of clock signals;

a third switch connected between a second end of the dump capacitor and the second input terminal of the operational amplifier to redistribute charges dumped from the dump capacitor to the feedback capacitor in response to the first clock signal; and a fourth switch connected between the second end of the dump capacitor and the first input terminal to discharge the dump capacitor in response to the second clock signal, and wherein the first clock signal and the second clock signal are applied complimentarily.

7. The analog reference voltage generator of claim 3, wherein each of the plurality of dump cells comprises:

a first switch connected between an input voltage terminal receiving the input voltage and a first end of the dump capacitor to provide the input voltage to the first end of the dump capacitor in response to a first clock signal among the plurality of clock signals;

a second switch connected between the first input terminal of the operational amplifier and the first end of the dump capacitor to charge the dump capacitor with the input offset voltage in response to a second clock signal among the plurality of clock signals;

a third switch connected between a second end of the dump capacitor and the second input terminal of the operational amplifier to redistribute charges dumped from the dump capacitor to the feedback capacitor in response to the first clock signal; and a fourth switch connected between the second end of the dump capacitor and the input voltage terminal to charge the dump capacitor with the input offset voltage in response to the second clock signal, and wherein the first clock signal and the second clock signal are applied complimentarily.

8. An analog reference voltage generator comprising:

an operational amplifier having a first input terminal receiving an input offset voltage determining an initial voltage and having an output terminal;

a feedback capacitor connected between a second input terminal of the operational amplifier and the output terminal; and a plurality of dump cells comprising dump capacitors, respectively, and configured to apply an input voltage to the dump capacitors at different respective timings and to accumulate charges stored at the dump capacitors in the feedback capacitor in response to a plurality of clock signals, which do not overlap each other in time, thereby changing an output signal of the output terminal in the same direction in response to a first logic level of each of the plurality of clock signals, wherein each of the plurality of dump cells comprises:

a first switch connected between an input voltage terminal receiving the input voltage and a first end of the dump capacitor to provide the input voltage to the first end of the dump capacitor in response to a first clock signal among the plurality of clock signals;

a second switch connected between the first input terminal of the operational amplifier and the first end of the dump capacitor to charge the dump capacitor with the input offset voltage in response to a second clock signal among the plurality of clock signals;

a third switch connected between a second end of the dump capacitor and the second input terminal of the operational amplifier to redistribute charges dumped from the dump capacitor to the feedback capacitor in response to the first clock signal; and a fourth switch connected between the second end of the dump capacitor and the first input terminal to charge the dump capacitor with the input offset voltage in response to the second clock signal, and wherein the first clock signal and the second clock signal are applied complimentarily.

9. The analog reference voltage generator of claim 8, wherein the output signal repeatedly increases or decreases.

10. The analog reference voltage generator of claim 8, further comprising a reset unit connected in parallel with the feedback capacitor to maintain the output signal at the input offset voltage in response to a reset signal.

11. An analog-to-digital converter comprising:

an analog reference voltage generator configured to output an analog reference signal; and a comparator configured to compare the analog reference voltage with an analog input signal and output a digital value according to a result of the comparison, wherein the analog reference voltage generator comprises:

an operational amplifier having a first input terminal receiving an input offset voltage determining an initial voltage and having an output terminal;

a feedback capacitor connected between a second input terminal of the operational amplifier and the output terminal; and a plurality of dump cells comprising dump capacitors, respectively, and configured to apply an input voltage to the dump capacitors at different respective timings and accumulate charges stored in the dump capacitors in the feedback capacitor in response to a plurality of clock signals, which do not overlap each other in time, thereby changing an output signal of the output terminal, and wherein the plurality of clock signals are obtained by dividing a master clock signal by the number of the plurality of clock signals, and when a logic level of the master clock signal changes as many times as the number of the plurality of clock signals, a voltage level of the output signal changes to the same direction in response to both of a first logic level and a second logic level of the master clock signal.

12. The analog-to-digital converter of claim 11, further comprising a latch unit configured to store the digital value, wherein the analog input signal is a difference between two sampling signals and the latch unit stores the digital value corresponding to the difference between the two sampling signals.

13. The analog-to-digital converter of claim 11, further comprising a latch unit configured to store the digital value, wherein the analog input signal comprises a plurality of consecutive sampling signals and the latch unit calculates and stores a difference between digital values of the consecutive sampling signals.

14. An image sensor comprising:

a pixel array having pixels arrayed in a predetermined color pattern; and an analog-to-digital converter configured to convert an analog signal output from the pixel array into a digital signal, wherein the analog-to-digital converter comprises:

an analog reference voltage generator configured to generate an analog reference signal; and a comparator configured to compare the analog reference signal with an analog signal output from the pixel array and output a digital value according to a result of the comparison, wherein the analog reference signal generator comprises:

an operational amplifier having a first input terminal receiving an input offset voltage determining an initial voltage and having an output terminal;

a feedback capacitor connected between a second input terminal of the operational amplifier and the output terminal; and a plurality of dump cells comprising dump capacitors, respectively, and configured to apply an input voltage to the dump capacitors at different respective timings and to accumulate charges stored in the dump capacitors in the feedback capacitor in response to a plurality of clock signals, which do not overlap each other, thereby changing an output signal of the output terminal, and wherein the plurality of clock signals are obtained by dividing a master clock signal by the number of the plurality of clock signals, and when a logic level of the master clock signal changes as many times as the number of the plurality of clock signals, a voltage level of the output signal changes to the same direction in response to both of a first logic level and a second logic level of the master clock signal.

15. The image sensor of claim 14, further comprising a latch unit configured to store the digital value, wherein the analog signal is a difference between two sampling signals and the latch unit stores the digital value corresponding to the difference between the two sampling signals.

16. The image sensor of claim 14, further comprising a latch unit configured to store the digital value, wherein the analog signal comprises a plurality of consecutive sampling signals and the latch unit calculates and stores a difference between digital values of the sampling signals.

* * * * *